(12) United States Patent
Yoon et al.

(10) Patent No.: US 9,780,167 B2
(45) Date of Patent: Oct. 3, 2017

(54) METHOD OF MANUFACTURING SILICON NANOWIRE ARRAY

(71) Applicant: GWANGJU INSTITUTE OF SCIENCE AND TECHNOLOGY, Gwangju (KR)

(72) Inventors: Myung Han Yoon, Gwangju (KR); Se Yeong Lee, Gwangju (KR)

(73) Assignee: GWANGJU INSTITUTE OF SCIENCE AND TECHNOLOGY, Gwangju (KR)

(*) Notice: Subject to any disclaimer, the term of this patent is extended or adjusted under 35 U.S.C. 154(b) by 0 days.

(21) Appl. No.: 14/908,930

(22) PCT Filed: Jul. 14, 2014

(86) PCT No.: PCT/KR2014/006294
§ 371 (c)(1),
(2) Date: Jun. 13, 2016

(87) PCT Pub. No.: WO2015/012516
PCT Pub. Date: Jan. 29, 2015

(65) Prior Publication Data
US 2016/0308001 A1 Oct. 20, 2016

(30) Foreign Application Priority Data
Jul. 22, 2013 (KR) .......................... 10-2013-0086180

(51) Int. Cl.
*H01L 29/06* (2006.01)
*B81C 1/00* (2006.01)
(Continued)

(52) U.S. Cl.
CPC ...... *H01L 29/0676* (2013.01); *B81C 1/00031* (2013.01); *H01L 21/022* (2013.01);
(Continued)

(58) Field of Classification Search
CPC .. C08F 293/00; C08F 297/00; B81C 1/00031; B81C 2201/0149; B82Y 40/00;
(Continued)

(56) References Cited

U.S. PATENT DOCUMENTS

2012/0214066 A1* 8/2012 Miller .................... B82Y 30/00
429/219
2012/0322164 A1* 12/2012 Lal ......................... B82Y 10/00
436/501
(Continued)

FOREIGN PATENT DOCUMENTS

KR 100550452 B1 2/2006
KR 100987331 B1 10/2010
(Continued)

OTHER PUBLICATIONS

Kuiqing Peng et al., Ordered silicon nanowire arrays via nanosphere lithography and metal-introduced etching, book, published Apr. 20, 2007, 163123-1~163123-3 pages, vol. 90, American Institute of Physics.
(Continued)

*Primary Examiner* — Joshua King
*Assistant Examiner* — Mohammed R Alam
(74) *Attorney, Agent, or Firm* — Hauptman Ham, LLP

(57) ABSTRACT

Provided is a method for manufacturing a silicon nanowire array comprising the steps of: positioning plastic particles separated apart from one another in a uniform random pattern on a silicon substrate; forming a catalyst layer between the plastic particles; removing the plastic particles; vertically etching portions of the silicon substrate that contact the catalyst layer; and removing the catalyst layer. The present invention provides a simple and cost-effective process, enables mass-production through large surface area processing, enables the manufacture of nanowire even at a
(Continued)

site having limited resources, and enables the structures of nanowire to be individually controlled.

12 Claims, 6 Drawing Sheets

(51) Int. Cl.
    *H01L 21/02*     (2006.01)
    *H01L 21/306*     (2006.01)
    *H01L 21/3205*     (2006.01)
    *H01L 29/16*     (2006.01)

(52) U.S. Cl.
    CPC .. *H01L 21/02118* (2013.01); *H01L 21/02282* (2013.01); *H01L 21/30604* (2013.01); *H01L 21/32051* (2013.01); *H01L 29/16* (2013.01); *B81B 2203/0361* (2013.01); *B81C 2201/0133* (2013.01); *B81C 2201/0149* (2013.01)

(58) Field of Classification Search
    CPC ........... B82Y 30/00; B81B 2203/0361; H01M 10/0436; H01M 4/134; H01M 10/052; H01M 4/139; H01M 4/36; Y02P 70/54; Y02E 60/122
    See application file for complete search history.

(56) References Cited

U.S. PATENT DOCUMENTS

| 2013/0020278 A1* | 1/2013 | Park | C08F 293/00 216/11 |
| 2013/0040412 A1* | 2/2013 | Park | H01M 4/134 438/49 |
| 2013/0244003 A1* | 9/2013 | Yoo | B82Y 30/00 428/143 |

FOREIGN PATENT DOCUMENTS

| KR | 1020110123578 A | 11/2011 |
| KR | 20120018499 A | 3/2012 |
| KR | 10-2012-0057539 | * 6/2012 |

OTHER PUBLICATIONS

International Search Report for PCT/KR2014/006294 dated Nov. 27, 2014, citing above reference(s).

* cited by examiner

METHOD OF MANUFACTURING SILICON NANOWIRE ARRAY

CROSS REFERENCE TO RELATED APPLICATION

This application claims the priority of Korean Patent Application No. 10-2013-0086180, filed on Jul. 22, 2013 in the KIPO (Korean Intellectual Property Office). Further, this application is the National Phase application of International Application No. PCT/KR2014/006294 filed on Jul. 14, 2014. The entire disclosure of each of the above application is incorporated herein by reference.

TECHNICAL FIELD

The present invention relates to a method for manufacturing a silicon nanowire array.

BACKGROUND ART

A nanowire is one of various semiconductor nanostructures and refers to a wire structure that has nanoscale dimensions. Generally, a nanowire includes a wire having a diameter of less than 10 nm to several hundred nanometers.

Methods for manufacturing such nanowires are divided into three major types.

First, there has been proposed a method in which a photoresist is patterned into nanoscale dimensions using an e-beam lithography apparatus, followed by etching silicon into nanoscale dimensions using the patterned photoresist as a mask, thereby manufacturing two-dimensional silicon nanowires.

However, such a conventional method for manufacturing silicon nanowires is unsuitable for mass production due to high fabrication costs.

Second, there has been proposed a vapor-liquid-solid (VLS) method which is a self-assembly method wherein a metal catalyst having nanoscale dimensions is formed, followed by introduction of a reaction gas ($SiH_4$) while maintaining a high temperature of about 950° C., thereby growing two-dimensional silicon nanowires.

However, this method has difficulty in controlling a structure of nanowires and cannot control a direction in which silicon nanowires are grown.

Third, there has been proposed etching using a solution process. Etching using a solution process can provide reduction in time and cost, as compared with the self-assembly method. In the method for manufacturing silicon nanowires using a solution process, a hexagonal lattice pattern using nanostructures has been mainly used to precisely control geometric parameters (diameter, height, density, and the like) of silicon nanowires. However, it is difficult for this method to achieve individual control of parameters of the nanowires and to fabricate large-area nanowires.

DISCLOSURE

Technical Problem

It is an aspect of the present invention to provide a method for manufacturing a nanowire array, which is capable of independently controlling geometric parameters (diameter, length, density, location, and the like) of nanowires and is cost-effective and allows mass production.

Technical Solution

In accordance with one aspect of the present invention, there is provided a method for manufacturing a silicon nanowire array, comprising: placing plastic particles separated from each other in a uniform random pattern on a silicon substrate; forming a catalyst layer between the plastic particles; removing the plastic particles; vertically etching a portion of the silicon substrate contacting the catalyst layer; and removing the catalyst layer.

Advantageous Effects

According to the present invention, it is possible to provide a method for manufacturing nanowires, which provides a simple process, is cost-effective, allows mass production by large-area processing, and allows fabrication of nanowires even in a resource-constrained environment. In addition, the present invention allows individual control of the structure of the nanowires and is thus expected to be applied to various fields using the nanowires, such as a solar energy industry including electronic devices and solar cells, biosensors, and the like.

BEST MODE

As used herein, the term "nanoscale" or "nano" may refer to a size of 1 nm to less than 1000 nm, without being limited thereto.

Hereinafter, embodiments of the present invention will be described with reference to the accompanying drawings such that those skilled in the art to which the present invention pertains can easily realize the present invention.

Recently, nanoscale materials have emerged as a very important field of study due to their new physicochemical properties such as unique electrical, optical, and mechanical characteristics. In addition, studies on nanostructures reported so far show that nanomaterials have the potential to be new materials for optical devices in the future. Particularly, a nanoscale device has increased surface/volume ratio due to small size thereof and thus allows predominant electrochemical reactions on a surface thereof to be applicable to various sensors. In particular, a vertical silicon nanowire array (vSiNWA) is in the spotlight because of useful electrical properties, large surface area, quantum confinement effect, biocompatibility, and the like.

However, since most nanoscale devices are difficult to apply to practical use due to difficulty in artificial manipulation, as an alternative, easier to manipulate materials for nanoscale devices, such as nanowires, are being studied. Nanowires can be widely applied to various fields such as biosensors, optical devices including lasers, transistors, memory devices, and the like.

Nanowires are currently manufactured by a growth method using catalysts. In such a nanowire fabrication method, nanowires are formed to a predetermined length, followed by removal of the catalysts. However, in this case, it is difficult to freely control diameter, length, density, location, and the like of the nanowires.

Figure 1:
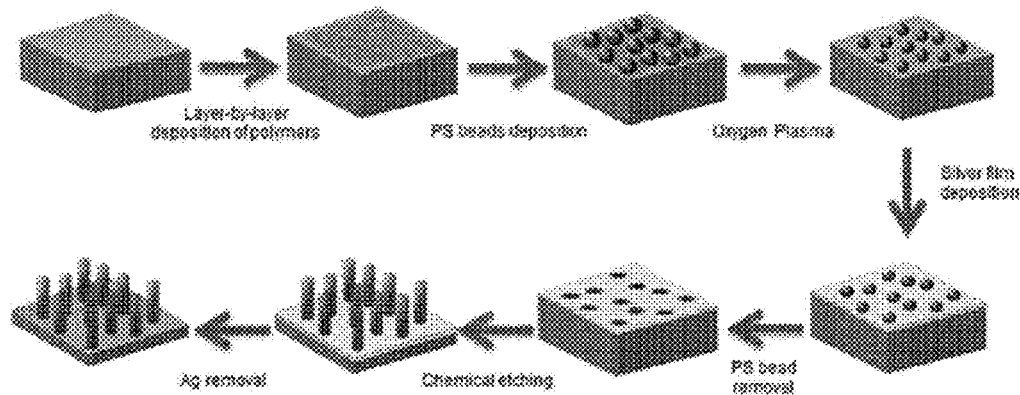
FIG. 1 is a flow diagram showing a method for manufacturing a nanowire array according to one embodiment of the present invention.

The present invention has been conceived to solve such a problem in the art and is aimed at providing a method for manufacturing a vertical silicon nanowire array through solution-based chemical etching. To this end, in accordance with one aspect of the invention, there is provided a method for manufacturing a silicon nanowire array which includes: placing plastic particles separated from each other in a uniform random pattern on a silicon substrate; forming a catalyst layer between the plastic particles; removing the plastic particles; vertically etching a portion of the silicon substrate contacting the catalyst layer; and removing the catalyst layer, as shown in FIG. 1.

Although crystalline silicon (Si) is selected as a material for nanowires in this embodiment, it should be understood that the present invention is not limited thereto, and amorphous silicon (a-Si) and polycrystalline-Si may also be formed into large area nanowires and a nano-pattern through a similar solution process.

In the present invention, a process of manufacturing a nanowire array using silicon will be mainly described.

First, plastic particles are arranged to be separated from each other on a silicon substrate. A polymer layer may be formed on the silicon substrate before arranging the plastic particles on the silicon substrate. To this end, a solution containing a cationic polymer electrolyte to the silicon substrate and a solution containing an anionic polymer electrolyte to the silicon substrate are alternately applied, thereby forming a lamellar self-assembled polymer layer in the form of layer-by-layer films. This process may be repeated several times. The cationic polymer electrolyte may be selected from the group consisting of polyarylamine chloride, polyethyleneimine, polydimethyldiallyl amide, polylysine, and combinations thereof, without being limited thereto, and the anionic polymer electrolyte may be selected from the group consisting of polystyrene sulfonate, polyacrylic acid, polyvinyl sulfate, heparin, and combinations thereof, without being limited thereto.

When a negatively charged substrate such as a silicon substrate is used, a solution containing a cationic polymer electrolyte charged opposite the charge of the substrate may be applied to the substrate first and then a solution containing an anionic polymer electrolyte may be applied. Here, preferably, a polymer electrolyte-containing solution applied last is charged opposite the charge of the plastic particles. In this way, a single or plurality of polymer layers may be formed on the substrate. Such polymer electrolyte-containing solutions may be applied to the substrate by any suitable method known in the art, for example, by dipping the substrate in the solutions, without being limited thereto.

Figure 9:
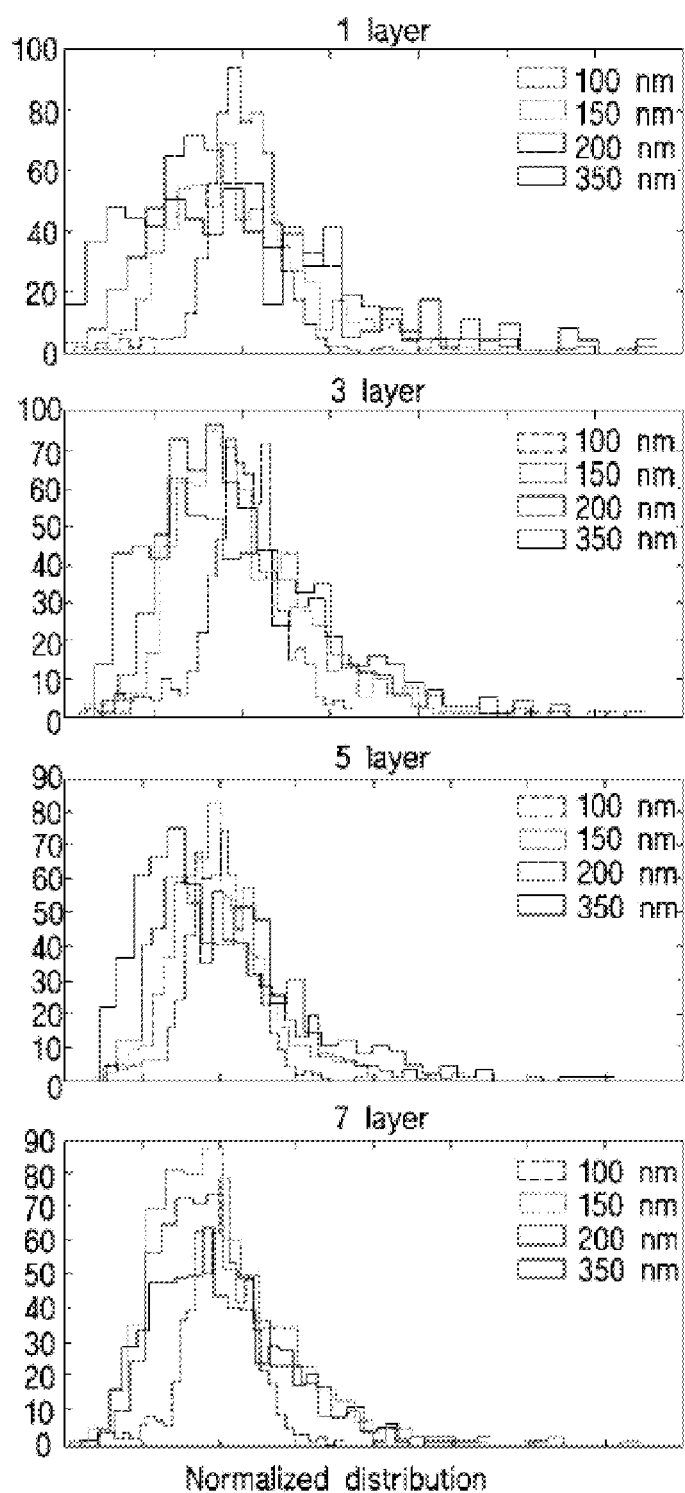
FIG. 9 is a graph showing distributions of plastic particles having different sizes depending upon the number of stacked polymer layers.

The polymer layer formed on the substrate serves as an adhesive through which plastic particles are attached to the substrate. In addition, the polymer layer helps the plastic particles to be uniformly spaced from each other by providing electrostatic force between the plastic particles. Referring to FIG. 9, there are shown distributions of plastic particles having a size of 100 nm, 150 nm, 200 nm or 350 nm, wherein the plastic particles are placed on the substrate to be separated from each other. When the polymer layer was formed in a total of 1, 3, 5, and 7 layers, distribution of the plastic particles became more uniform with increasing number of stacked polymer layers. Therefore, it can be seen that the polymer layer assists in uniform distribution of the plastic particles.

The plastic particles preferably have a spherical shape and may be formed in various shapes, as needed. The plastic particles may be scattered in a granular form on the silicon substrate with the polymer layer formed thereon, or may be applied to the substrate by spin coating a mixture of the plastic particles with a certain solution. The plastic particles may be arranged in a periodic or aperiodic manner. As a result, the plastic particles may be placed apart from one another in a uniform random pattern.

The plastic particles may be selected from the group consisting of polyethylene, polypropylene, polystyrene, polyethylene terephthalate, polybutylene terephthalate, polycarbonate, polymethyl methacrylate, polyphenylene oxide, and polyacetal, without being limited thereto, and such plastic particles preferably have a nano sc ale diameter.

When the plastic particles are dispersed in position, the polymer layer or solution component is removed by oxygen plasma treatment. Then, a catalyst layer is formed between the plastic particles by depositing the catalyst layer on the substrate with the plastic particles attached thereto. Specifically, the catalyst layer may be formed by sputtering, electron-beam evaporation, vacuum deposition, chemical vapor deposition, physical vapor deposition, atomic layer deposition (ALD), and the like.

Through the deposition process, the catalyst layer is formed in a space between the plastic particles as well as on exposed surfaces of the plastic particles. When the plastic particles are then removed, the catalyst layer remains absent at positions at which the plastic particles have been present.

The catalyst layer may include silver (Ag), gold (Au), platinum (Pt), copper (Cu), or a combination thereof.

In the present invention, a nanowire array is formed by chemical wet etching using a metal catalyst. As used herein, wet etching refers to a method in which a material to be etched is brought into contact with an etching solution, thereby etching the material through chemical reaction.

The etching solution may include an acid and a peroxide. A typical example of the acid may include hydrofluoric acid (HF) and a typical example of the peroxide may include hydrogen peroxide ($H_2O_2$). Time required for etching may also be adjusted by appropriately adjusting concentrations of the acid and the peroxide in the etching solution.

In a portion of the silicon substrate contacting the catalyst layer containing the metal catalyst, holes are formed in silicon as hydrogen peroxide is reduced due to the metal catalyst. A region where such holes are abundant is exposed to the acid to be dissolved.

Figure 2:
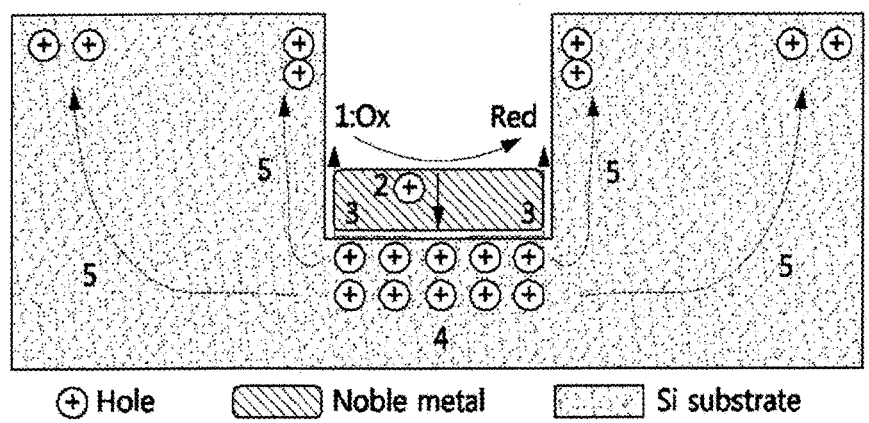
FIG. 2 is a view illustrating a mechanism of chemical etching with a metal catalyst according to one embodiment of the present invention.

Now, a reaction mechanism of the above process will be described in detail with reference to FIG. 2.

(Cathode Reaction)

$$H_2O_2 + 2H^+ + 2H_2O$$

$$2H^+ + 2e^- \rightarrow H_2$$

(Anode Reaction)

$$Si + 2H_2O \rightarrow SiO_2 + 4H^+ + 4e^-$$

$$SiO_2 + 6HF \rightarrow H_2SiF_6 + 2H_2O$$

$$Si + 4HF \rightarrow SiF_4 + H^+ 4e^-$$

When the reactions as above are repeated, silicon under the catalyst layer is etched by dissolution and a metal in the catalyst layer falls onto underlying silicon. After etching is completed by repetition of this process, the metal is finally removed, thereby obtaining a desired nanowire array.

Here, the metal in the catalyst layer may be removed using aqua regia, which is a mixture of nitric acid and hydrochloric acid.

In the present invention, structural parameters of nanowires may be controlled by appropriately adjusting process conditions. Nanowires with individually controlled structural parameters, i.e. diameter, height, density, location, and the like, may be utilized in observing neuronal interfaces.

Figure 3:
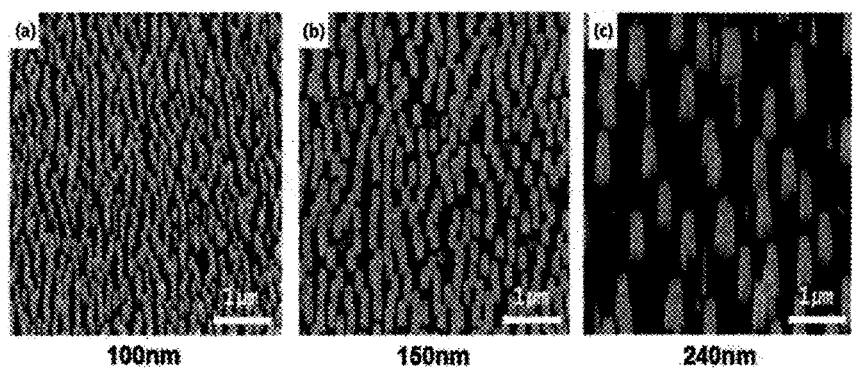
FIG. 3 shows images showing diameters of silicon nanowires depending upon the size of polystyrene beads according to one embodiment of the present invention.

By way of an example of methods for controlling structural parameters, the plastic particles may be controlled in size so as to adjust diameter of nanowires. As shown in FIG. 3, it can be seen that nanowires having a diameter of 100 nm ((a) in FIG. 3), 150 nm ((b) in FIG. 3), and 240 nm ((c) in FIG. 3) were obtained using plastic particles having a size of 100 nm, 150 nm, and 240 nm, respectively.

Figure 4:
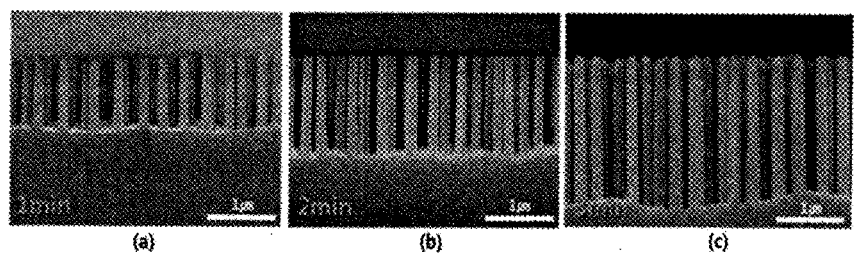
FIG. 4 shows images showing heights of silicon nanowires depending upon etching time according to one embodiment of the present invention.

In addition, height of nanowires, i.e. length of the nanowires may be adjusted by controlling the period of time for which etching is performed using an etching solution. Here, the height or length of nanowires increases with increasing etching time. As shown in FIG. 4, the nanowires had an average height of less than 0.9 μm, less than 1.4 μm, and less than 1.8 μm for an etching time of 1 minute ((a) in FIG. 4), 2 minutes ((b) in FIG. 4), and 3 minutes ((c) in FIG. 4), respectively.

Further, density of a nanowire array may be adjusted by controlling the distance between the plastic particles. In terms of fabrication process, density of the plastic particles in a solution containing the plastic particles is controlled by adjusting the dilution ratio of the solution with deionized water, followed by application of the solution, whereby the distance between the applied plastic particles can be controlled.

Figure 5:
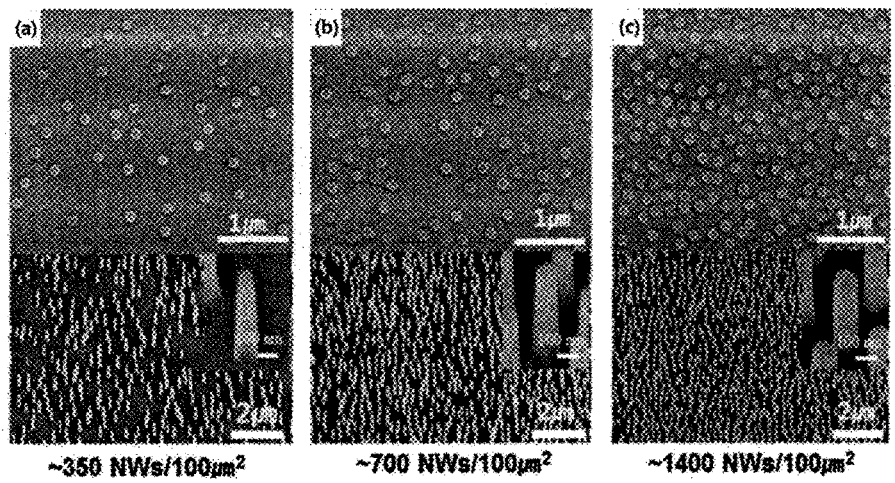
FIG. 5 shows images showing density of a silicon nanowire array at each density of polystyrene beads according to one embodiment of the present invention.

As shown in FIG. 5, it can be seen that, by appropriately adjusting the dilution ratio of the solution containing the plastic particles with deionized water, it is possible to fabricate nanowire array substrates, the density of which is controlled in density such that the number of nanowires per sectional area of 100 μm² becomes 350 or less ((a) in FIG. 5), 700 or less ((b) in FIG. 5), and 1400 or less ((c) in FIG. 5), respectively.

The nanowire array according to the present invention may have a periodic structure formed in a predetermined pattern. Such a structure may be realized by combination of metal assisted chemical etching (MACE) and photolithography.

Figure 7:
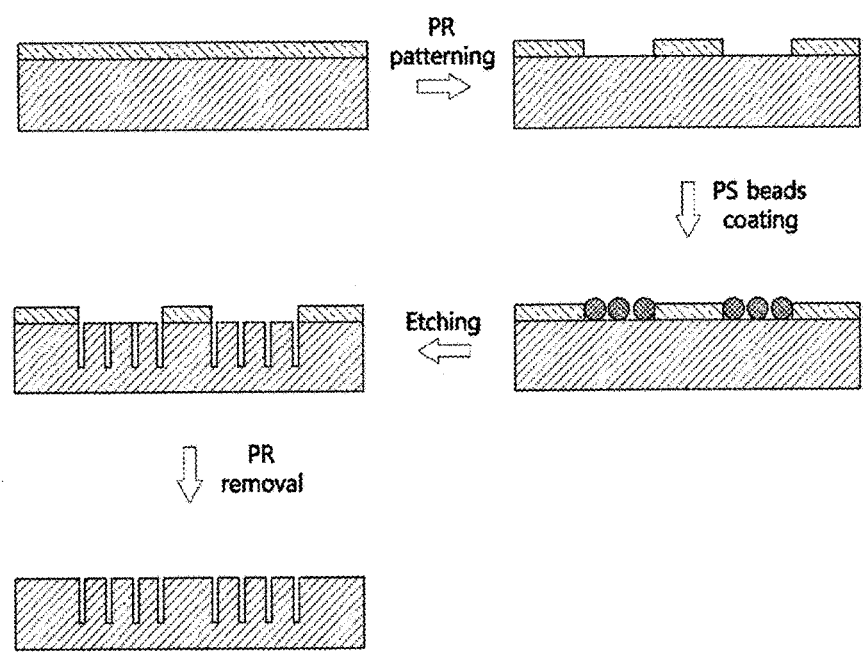
FIG. 7 is a view showing a patterning process of a vertical silicon nanowire array (vSiNWA) according to one embodiment of the present invention.

Now, a process of etching in a pattern will be described in detail with reference to FIG. 7.

A photoresist is applied to a silicon substrate by spin coating, followed by photolithography using a desired pattern mask. A polymer layer is formed on the patterned silicon substrate by layer-by-layer self-assembly, and the plastic particles having a desired size are placed thereon. Then, a metal catalyst layer is deposited thereon by the method as described above, followed by chemical reaction in an etching solution, thereby forming a vertical nanowire array structure only at a desired pattern portion.

In addition, the nanowire array according to the present invention may have an aperiodic nanostructure by randomly dispersing and coating the plastic particles. In other words, nanospheres may be uniformly dispersed and coated in a random manner rather than in a hexagonal lattice pattern by combination of layer-by-layer self-assembly and nanosphere lithography to individually control geometric parameters of nanowires, thereby manufacturing a nanowire array having an aperiodic arrangement.

Figure 6:
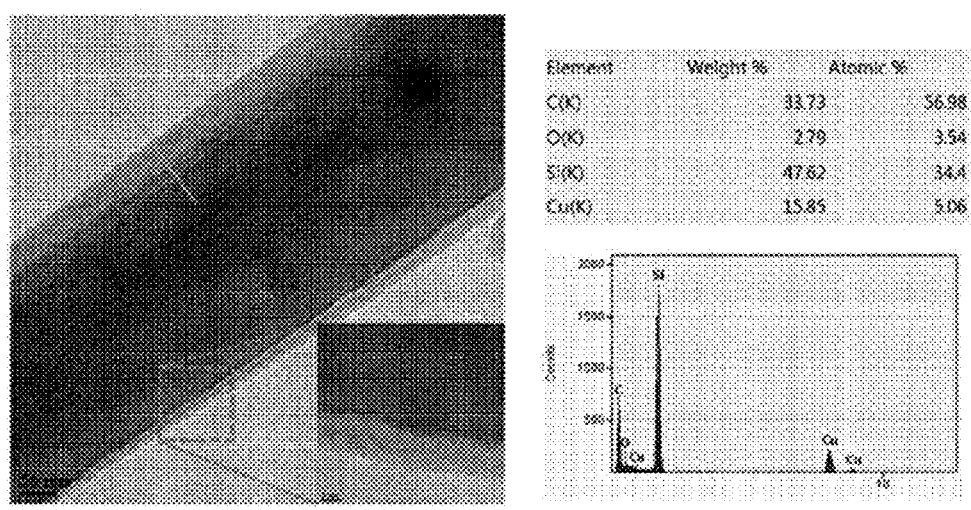
FIG. 6 shows TEM and EDX analysis images of silicon nanowires manufactured according to one embodiment of the present invention.

Results of characterization as shown in FIG. 6 were obtained by transmission electron microscopy (TEM) and energy-dispersive X-ray analysis (EDX) of manufactured silicon nanowires.

By TEM, crystallinity and surface structure of the manufactured silicon nanowires can be confirmed. It can be seen that surfaces of the nanowires have an amorphous shape and have many fine pores, which are characteristics in fabrication of nanowires by etching. The nanowires have a crystalline shape inside thereof and exhibit [100] crystallinity inherent to a silicon wafer. In addition, since it is confirmed that the manufactured silicon nanowires contain silicon and oxygen atoms by component analysis through EDX, it can be inferred that the silicon nanowires have a silicon oxide layer on surfaces thereof.

Further, at least one material layer may be coated onto outer surfaces of silicon nanowires, which are used as a template, thereby obtaining a core-shell nanowire structure capable of providing predetermined optical, electrical, magnetic, mechanical and chemical functions, wherein the material layer is formed of, for example, a metal such as Si, Ge, Cu, Ni, Cr, Fe, Ag, Ti, Co, Zn, Mg, Pt, Pd, Os, Au, Pb, Ir, Mo, V, and Al, an alloy thereof, a metal oxide such as $SnO_2$, $Cr_2O_3$, $Fe_2O_3$, $Fe_3O_4$, FeO, NiO, AgO, $TiO_2$, $Co_2O_3$, $Co_3O_4$, CoO, ZnO, PtO, PdO, $VO_2$, $MoO_2$ and PbO, a polymer such as polyimide, or a combination thereof having a multilayer structure such as $Ti/TiO_2$. Such a material may be coated onto the silicon nanowires by any typical thin-film deposition method known in the art, such as chemical vapor deposition, atomic layer deposition, and sputtering.

In some embodiments, after coating of the silicon nanowires with at least one material layer, the silicon nanowires may be removed, thereby obtaining a nanotube array structure in which the material layer is left alone. As such, the silicon nanowires used as a template may be present inside the nanotube array structure or may be removed by dry etching with plasma or wet etching with HF depending upon device fabrication method.

Figure 8:
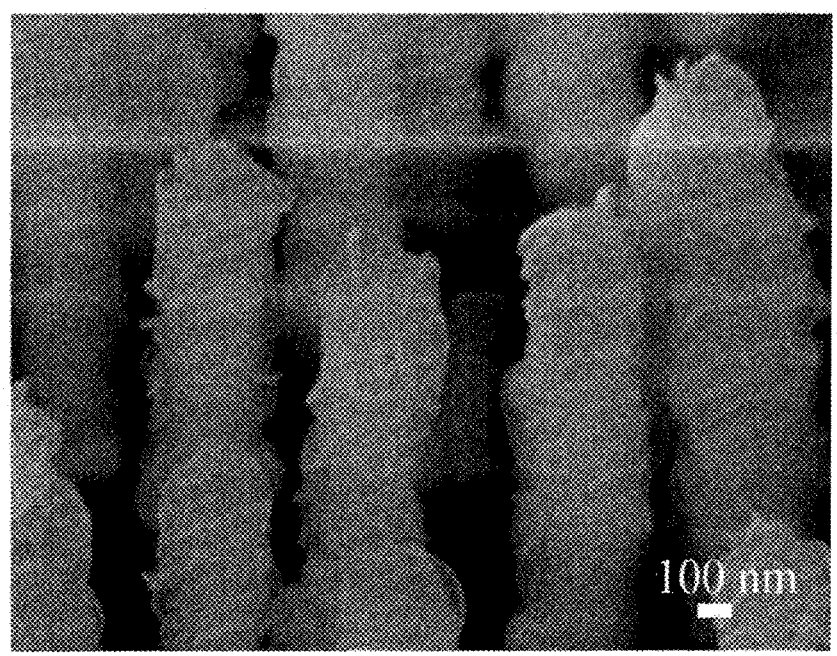
FIG. 8 is an image showing a core-shell structure of $FeO_x$ formed using silicon nanowires as a template.

A method for forming a core-shell nanowire structure is as follows. In the method, a process of substituting a surface of a silicon nanowire template formed by the method described above is needed. A $FeO_x$ solution is prepared by a sol-gel process, followed by placing a surface-treated silicon nanowire template into the solution. Then, the silicon nanowire template is treated using oxidizing water, thereby manufacturing a core-shell structure of $FeO_x$ taking the form of the silicon nanowires, as shown in FIG. 8.

What is claimed is:
1. A method for manufacturing a silicon nanowire array, comprising:
placing plastic particles separated apart from one another in a uniform random pattern on a silicon substrate with a polyelectrolyte multilayer as an adhesive formed thereon;
forming a catalyst layer between the plastic particles;
removing the plastic particles;

vertically etching portions of the silicon substrate contacting the catalyst layer; and removing the catalyst layer, wherein removing the plastic particles is performed after forming the catalyst layer between the plastic particles.

2. The method according to claim 1, wherein the polyelectrolyte multilayer is formed by alternately applying a solution containing a cationic polymer electrolyte and a solution containing an anionic polymer electrolyte to the silicon substrate.

3. The method according to claim 2, wherein the cationic polymer electrolyte is selected from the group consisting of polyarylamine chloride, polyethyleneimine, polydimethyldiallyl amide, polylysine, and combinations thereof.

4. The method according to claim 2, wherein the anionic polymer electrolyte is selected from the group consisting of polystyrene sulfonate, polyacrylic acid, polyvinyl sulfate, heparin, and combinations thereof.

5. The method according to claim 1, wherein the plastic is selected from the group consisting of polyethylene, polypropylene, polystyrene, polyethylene terephthalate, polybutylene terephthalate, polycarbonate, polymethyl methacrylate, polyphenylene oxide, and polyacetal.

6. The method according to claim 1, wherein the catalyst layer comprises silver (Ag), gold (Au), platinum (Pt), copper (Cu), or a combination thereof.

7. The method according to claim 1, wherein forming the catalyst layer is performed by deposition.

8. The method according to claim 1, wherein etching is performed by wet etching.

9. The method according to claim 8, wherein the wet etching is performed using a solution containing an acid and a peroxide.

10. The method according to claim 1, wherein a diameter of silicon nanowires is adjusted by controlling the size of the plastic particles.

11. The method according to claim 1, wherein a density of the silicon nanowire array is adjusted by controlling a distance between the plastic particles.

12. The method according to claim 1, wherein a height of silicon nanowires is adjusted by controlling a period of time for which etching is performed.

* * * * *